(12) United States Patent
Leclerc et al.

(10) Patent No.: US 6,630,254 B2
(45) Date of Patent: Oct. 7, 2003

(54) CONJUGATED POLYCARBAZOLE DERIVATIVES IN ORGANIC LIGHT EMITTING DIODES

(75) Inventors: Mario Leclerc, Ancienne Lorette (CA); Jean-Francois Morin, Saint Foy (CA); Isabelle Levesque, Quebec (CA); Marie D'Iorio, Gloucester (CA); Christophe Py, Ottawa (CA)

(73) Assignee: National Research Council of Canada, Ottawa (CA)

( * ) Notice: Subject to any disclaimer, the term of this patent is extended or adjusted under 35 U.S.C. 154(b) by 92 days.

(21) Appl. No.: 09/828,926

(22) Filed: Apr. 10, 2001

(65) Prior Publication Data

US 2003/0008172 A1 Jan. 9, 2003

(51) Int. Cl.$^7$ ............................................... H05B 33/14
(52) U.S. Cl. ........................ 428/690; 428/917; 313/504; 313/506; 257/40; 257/103; 252/301.35
(58) Field of Search .................. 428/690, 917; 313/504, 506; 528/423, 422, 373, 401, 397, 398, 485, 487, 492; 257/40, 103; 252/301.35

(56) References Cited

U.S. PATENT DOCUMENTS

| 5,777,070 A | | 7/1998 | Inbasekaran et al. ....... 528/394 |
| 6,111,063 A | * | 8/2000 | Park et al. .................... 528/423 |
| 2001/0021464 A1 | * | 9/2001 | Hwang et al. .............. 428/690 |
| 2002/0103332 A1 | * | 8/2002 | Leclerc et al. .............. 528/423 |

FOREIGN PATENT DOCUMENTS

| JP | 09-12548 | * | 1/1997 |
| JP | 2000-344873 | * | 12/2000 |

OTHER PUBLICATIONS

"Optical and electrical characterizations of poly(N–alkyl-carbazole) light–emitting diodes" Synthetic Metals, 97(2), pp. 151–155, 1998 (abstract).*

"Blue–Light–Emitting Fluorene–Based Polymers with Tunable Electronic Properties" Chemistry of Materials, 13(6), pp. 1984–1991, 2001.*

"Syntheses of Conjugated Polymers Derived from N–Alkyl–2,7–carbazoles", Macromolecules, 34(14), pp. 4680–4682, 2001.*

"Semiconducting polymers and their solid–state properties: Are these materials semiconductor or large conjugated molecules?", Daniel J. Sandman, TRIP, vol. 2, No. 2, Feb., 1994, pp. 44–55.

"Dot–matrix display using organic light–emitting diodes", Wakimoto et al., Journal of the SID 5/3, 1997, pp. 235–239.

"Organic electroluminescent diodes", C.W. Tang et al., Appl. Phys. Lett, 51(12), Sep. 1987, pp. 913–915.

"Synthesis of conjugated polymers derived from N–alkyl–2, 7–carbazoles", Jean–Francois Morin et al., Macromolecules 2001, 34, pp. 4680–4682.

* cited by examiner

*Primary Examiner*—Cynthia H. Kelly
*Assistant Examiner*—Dawn Garrett
(74) *Attorney, Agent, or Firm*—Marks & Clerk

(57) ABSTRACT

An Organic Light Emitting Diode (OLED) includes as active material a conjugated poly(N-alkyl-2,7-carbazole) derivative described by the formula:

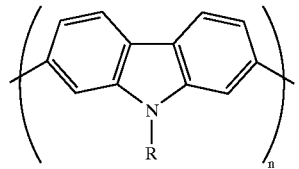

wherein n is an integer of about 3 to about 100, and R represents a substituant that is a linear or branched alkyl group containing 1 to 22 carbon atoms, or poly (ethyleneoxy), cyano, aryl, amide or benzoyl. Such OLEDs have improved light emitting properties, especially in the blue and red regions of the spectrum.

29 Claims, 4 Drawing Sheets

CONJUGATED POLYCARBAZOLE DERIVATIVES IN ORGANIC LIGHT EMITTING DIODES

BACKGROUND OF THE INVENTION

1. Field of the Invention

The present invention relates to the field of optics, and more particularly Organic Light Emitting Diodes (OLEDs).

2. Description of the Related Art

Organic materials show promise for electronic and optoelectronic applications. Low-cost of synthesis, processing and room temperature fabrication are among the economical advantages. OLEDs are of particular promise for displays as they can be tuned to any color, organic diodes are very efficient and the visual properties of the diodes are excellent. Liquid crystal displays are currently overwhelmingly dominating the laptop computer market, but the technology has limitations such as low efficiency, poor vision angle, and speed and temperature range limitations.

It has long been felt that a technically viable emissive display technology could compete with LCDs, and OLEDs are today considered in the best position to do just that. OLEDs are also of great interest for other markets, such as lighting.

Intense research is going on at the chemistry laboratory level to find materials with high luminous quantum efficiency, good color purity and stability for the application to OLED displays. While some materials meet or exceed some of the requirements for commercial displays, none meets them all. Tang and VanSlyke, from Eastman Kodak, discovered small molecules that yield very efficient and stable green diodes [U.S. Pat. No. 4,356,429, Oct. 26, 1982; C. W. Tang and S. A. VanSlyke, Appl. Phys. Lett. 51, 913 (1987)]. FIG. 1 shows a typical OLED diode as described by Tang and VanSlyke: it is composed of TPD (a triphenyl diamine derivative), a hole transport layer, and AlQ$_3$ (a chelated Aluminum hydroxyquinoline), an electron transport and emitter layer.

When a sufficiently high positive voltage is applied between the anode and cathode, holes are injected in the hole transport layer from an anode, electrons are injected in the electron transport layer from a cathode. Holes and electrons recombine at the interface between the two organic materials and create an exciton that will release energy as light or heat. Light is emitted through the anode, which can be Indium Tin Oxide, a transparent degenerate semiconductor with a relatively high work function that favors hole injection. The cathode is usually a low work function metal like Ca, Mg or Al. TPD and AlQ$_3$ are now commercially available. However, blue and red emitters in the same class of materials usually have shorter lifetimes and lower luminous efficiencies.

The glass transition temperature of small molecules is usually quite low (as low as 60° C. for TPD), so displays made of small molecules have difficulty meeting some of the temperature requirements. On the contrary, polymers usually have high glass transition temperatures. It is also desirable to find a family of materials that will emit in the three primary colors to permit the creation of full-color displays: this is easier with polymers than small molecules. Finally, small molecules have to be evaporated to form thin films, whereas polymers can be easily soluble and can be spun-on or reel-coated. This means that polymers are potentially lower cost to process and easier to coat on large surface for large display applications.

Conjugated polymers are considered a very important class of electroactive and photoactive materials because they possess a highly delocalized pi-electron system, and transport charges efficiently [Heeger, McDiarmid and Shirakawa, 2000 Nobel Prize, http://www.nobelprizes.com/]. Scientists from Cambridge University, UK, discovered that PPVs (poly(p-phenyenevinylene)s) can be a very efficient green emitter [U.S. Pat. No. 5,247,190, priority date Apr. 20, 1989; J. H. Burroughes et al, Nature, v347,539 (1990)].

FIG. 2 shows a typical diode as described by Burroughes et al. A 70 nm PPV is sandwiched between an ITO conductive transparent layer and an aluminum cathode. The thin PPV layer transports electrons, holes and is also the green emitter. When a sufficiently high positive voltage is applied between the anode and cathode, holes injected from the anode and electrons injected from the cathode recombine radiatively to produce green light. Many other compounds have been studied since and incorporated in diodes producing all colors [see for review R. H. Friend et al, Nature, v397, 121 (1999)]. Green, however, is still the only color with sufficient lifetime, so there is still the need for a family of polymers that will emit in all colors of the spectrum, and optimize their use in OLEDs.

SUMMARY OF THE INVENTION

According to the present invention there is provided an Organic Light Emitting Diode (OLED) comprising as its active material a conjugated poly(N-alkyl-2,7-carbazole) derivative described by the formula:

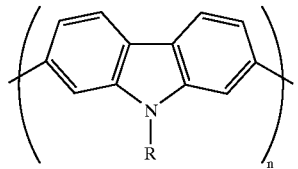

wherein n is an integer of about 3 to about 100, and R represents a substituant that is a linear or branched alkyl group containing 1 to 22 carbon atoms, or poly (ethyleneoxy), cyano, aryl, amide or benzoyl.

Polycarbazoles are a well-known class of polymers. Two of the present inventors have discovered how to synthesise highly conjugated poly(N-alkyl-2,7-carbazole) and have filed a patent application entitled "Conjugated Polycarbazole Derivatives and Process for the Synthesis thereof" on their method of synthesis, the contents of which are incorporated herein by reference. In the present invention the conjugated polycarbazole derivatives are used as the active material in OLEDs either alone or mixed with another material.

Carbazole monomers can also be alternated with other monomers to form copolymers according to the general formula:

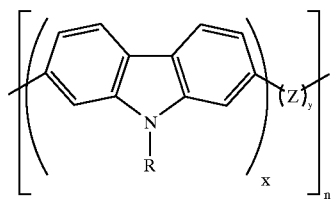

Where Z is any type of comonomer, x is an integer between 1 and 100, y is an integer between 0 and 100, and n is an integer of about 3 to about 100.

The conjugated polycarbazole derivatives comprise repeating or alternating units of the above formula. For example, the comonomers can be selected from ethylene, acetylene, $C_6$–$C_{22}$ mononuclear/polynuclear aromatic, $C_2$–$C_{10}$ mononuclear/polynuclear heterocyclic groups and tertiary arylamines. Examples of mononuclear/polynuclear aromatic groups are: fluorene, anthracene, phenylene, naphthylene, acenaphthene, phenanthrene, fluoranthene, pyrene, perylene, rubrene, chrysene, tetracene and pentacene.

Examples of mononuclear/polynuclear heterocyclic internal groups include 5-member heterocycles such as furan, thiophene, pyrrole, oxazole, isooxazole, oxadiazoles, thiazole, isothiazole, imidazole, thiadiazole, and pyrazoles; 6-member heterocycles such as pyridine, pyridazine, pyrimidine, pyrazine, triazines, and tetrazenes; benzo-fused ring systems such as benzoxazole, benzothiazole, benzimidazole, quinoline, isoquinoline, cinnoline, quinazoline, quinoxaline, phthalazine, benzothiadiazole, and benzotriazines; polynuclear fused condensed ring systems such as phenazine, phenanthridine, acridine, and diphenylene oxide. Examples of tertiary arylamine groups include triphenylamine, N,N'-diphenylbenzidine, N,N'-diphenyl-1,4-phenylenediamine, and diphenylnaphthylamine. Olefinic, arylamino, aromatic and heterocyclic aromatic groups containing up to 30 carbons are useful for the present purpose. They may be substituted optionally with one or more substituents. Examples of substituents include $C_1$–$C_{20}$ hydrocarbyl radicals, $C_1$–$C_{20}$ (thio)alkoxy radicals, $C_1$–$C_{20}$ (thio)aryloxy radicals, cyano, fluoro, chloro, $C_1$–$C_{20}$ alkoxycarbonyl, $C_1$–$C_{20}$ aryoxylcarbonyl, poly (alkyleneoxy) and alkyl(aryl)sulfonyl radicals. Such substituents may be selected to improve the solubility or processing characteristics of the polymer. In such cases, the substituent is preferably selected from alkyl alkoxy, poly (alkyleneoxy), and cyano.

OLEDs can consist of many different layers with different roles. They are sandwiched between two electrodes, metallic or semiconductive, to provide injection of electrodes and holes. There is a layer between those two electrodes where recombination of those charges takes place and produces the emission of light. That layer is referred to as the emitter. There might be layers on either or both sides, performing the specific task of transporting one of the charges, electrons or holes. The emitter layer itself might play the role of transport layer for one or both charges. There might be a layer or several layers between the emitter and either or both of the transport layers, or between the emitter and the electrodes, to confine excitons and improve the quantum efficiency of the device. There might be a layer or several layers between the organic layers and either or both of the electrodes to promote injection into the device.

The polycarbazole compounds can be used in OLEDs as hole transport layers, electron transport layers, emitters or any combination of those roles. They can be used either pure or blended or doped with other hole or electron transport materials. They can also be used in multilayer arrangements to promote confinement or as an alternative to doping.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENTS

Conjugated poly(N-alkyl-2,7-carbazole) derivatives can be synthesized by the following route:

Scheme 1

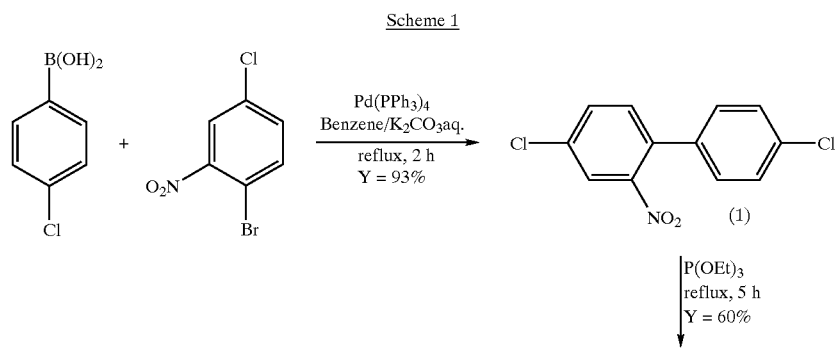

-continued
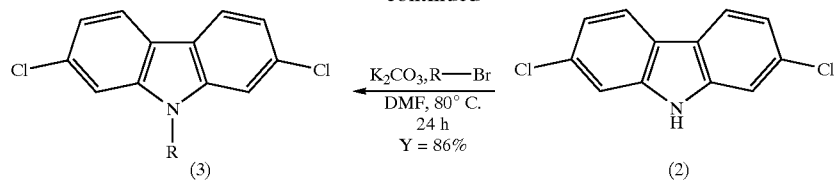
Scheme 2
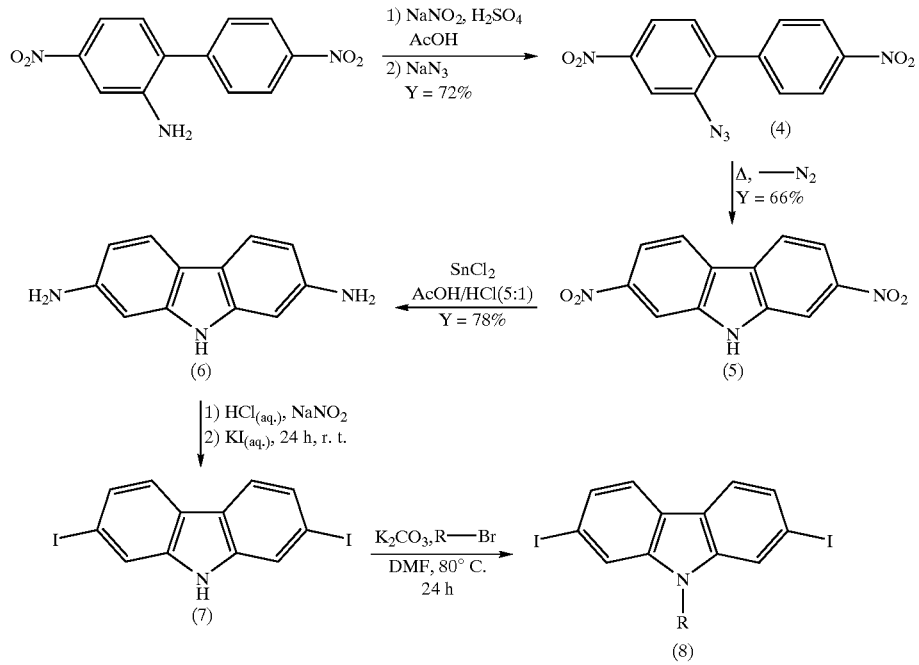
Global yield for steps 4 and 5 = 38%
Scheme 3
A)
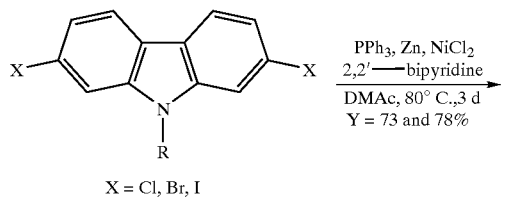
X = Cl, Br, I
B)
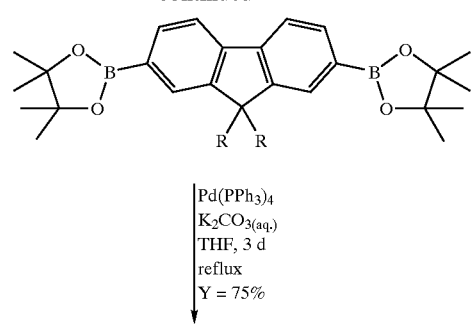

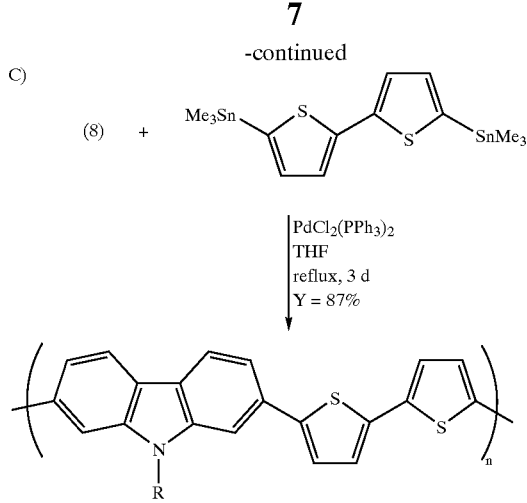

-continued

Figure 1:
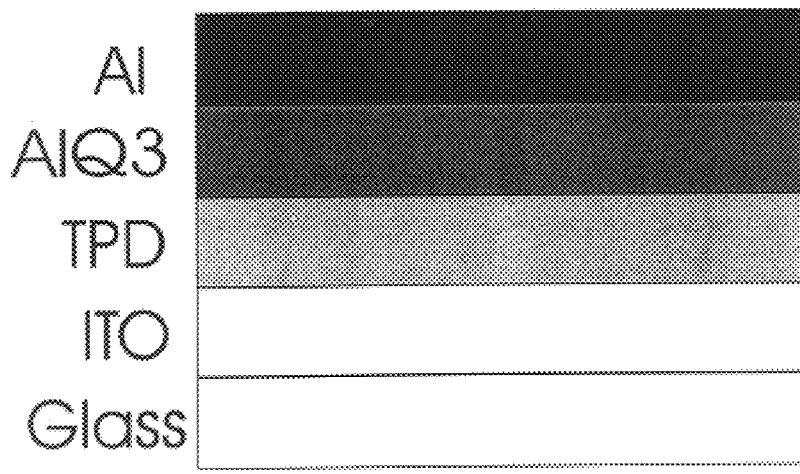
FIG. 1 shows a small-molecule light-emitting diode according to prior art.

The first prior art device shown in FIG. 1 consists of an ITO transparent anode on a glass substrate, a TPD hole transport layer, an AlQ$_3$ electron transport and emitter layer, and an Al cathode. When a sufficient positive voltage is applied between the anode and the cathode, holes are injected from the anode, electrons from the cathode and they recombine radiatively in the AlQ$_3$ emissive layer, producing light which is seen through the transparent anode and hole transport layers.

Figure 2:
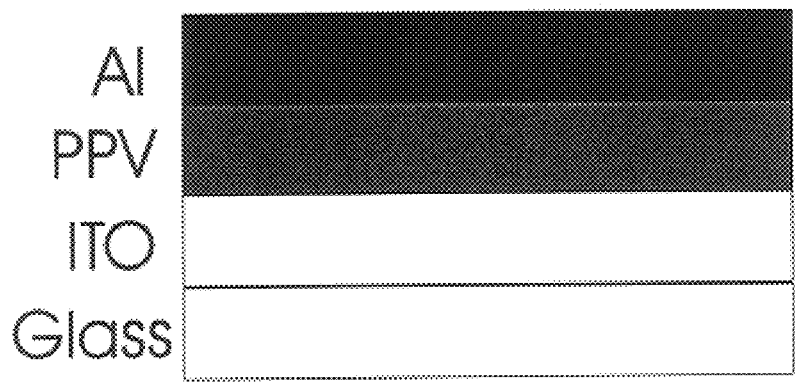
FIG. 2 shows a polymer light-emitting diode according to prior art.

The second prior device shown in FIG. 2 consists of an ITO transparent anode on a glass substrate, a thin PPV polymeric layer and an Al cathode. When a sufficiently high positive voltage is applied between the anode and cathode, holes injected from the anode and electrons injected from the cathode recombine radiatively to produce green light.

Figure 3:
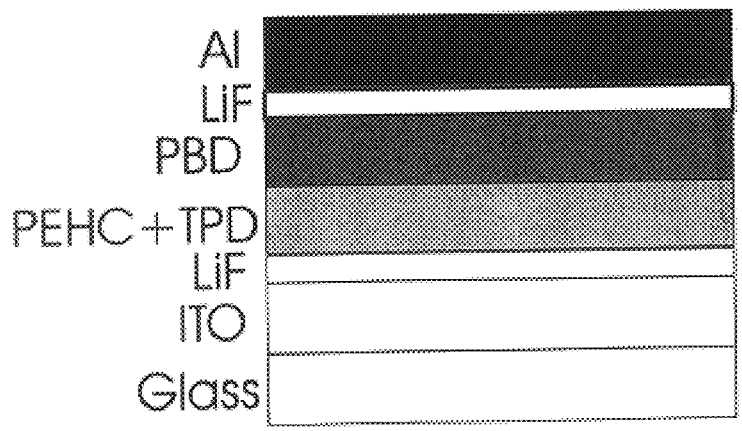
FIG. 3 shows a first embodiment of the invention where an OLED is formed using a PEHC polycarbazole thin film as the emitter.

In the embodiment of the invention, shown in FIG. 3, the diode consists of an Indium Tin Oxide transparent conductive anode on a glass substrate, a first thin LiF layer to promote hole injection, a blend of PEHC (poly(N-ethylhexyl)-2,7-carbazole) and TPD (NN'-diphenyl-NN'-bis(3-methylphenyl)-1,1'-biphenyl-4,4'-diamine) as the hole transport layer and emitter, PBD (2-(4-biphenylyl)-5-(4-tert-butylphenyl)-1,3,4-oxadiazole) as the electron transport layer, a second thin LiF layer to promote electron injection and an Al cathode.

FIRST EXAMPLE

In a first embodiment of the invention, shown in FIG. 3, an OLED was fabricated consisting of an Indium Tin Oxide transparent conductive anode on a glass substrate, a thin LiF layer to promote hole injection, a blend of PEHC (poly(N-ethylhexyl)-2,7-carbazole) and TPD (N,N'-diphenyl-N,N'-bis(3-methylphenyl)-1,1'-biphenyl-4,4'-diamine) as the hole transport layer and emitter, Bu-PBD (2-(4-biphenylyl)-5-(4-tert-butylphenyl)-1,3,4-oxadiazole) as the electron transport layer, a thin LiF layer to promote electron injection, and an Al cathode. The blend of PEHC and TPD is solubilized in chloroform:toluene in a ratio of 9.8:0.2, and spin-coated. PBD, LiF and Al layers were thermally evaporated.

Figure 4:
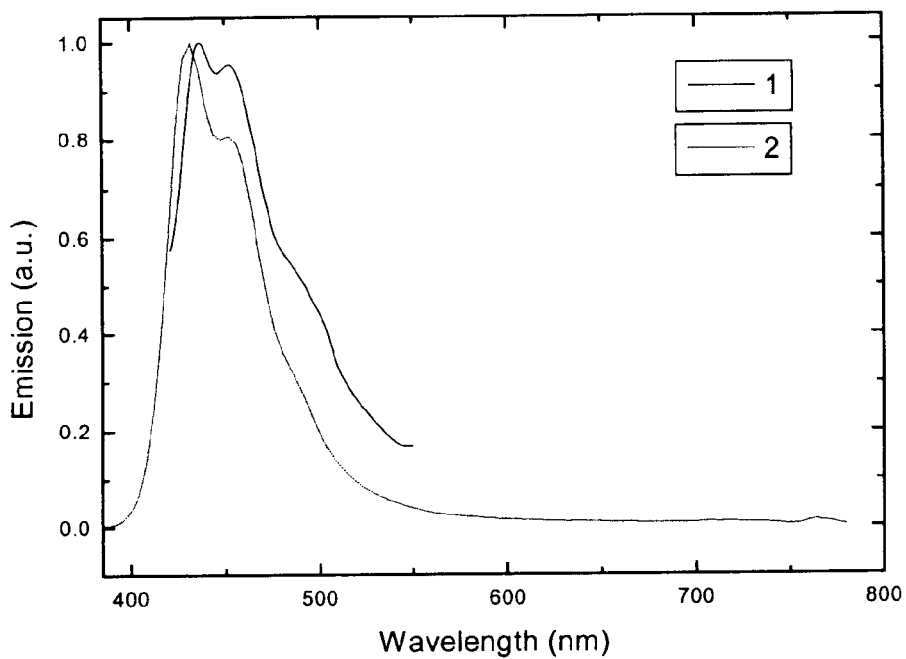
FIG. 4 shows the photoluminescence spectrum of PEHC in the solid state (curve 1) and the electroluminescent spectrum of the diode described in FIG. 3 (curve 2)

The diode produces the electroluminescence spectrum (curve 2) shown in FIG. 4, compared with the photoluminescence spectrum (curve 1) of PEHC in the solid state.

Both spectra seem to show a maximum of emission at similar wavelengths, i.e. in the blue range, with two peaks around 437 nm and 453 nm. The electroluminescence is thus originating from the polymer itself. No emission of an excimer is observed (no emission peak at higher wavelength). The relative intensity of the peaks are somewhat different in PL and EL, and this may be due to a difference in morphology of both films. TPD or PBD do not seem to affect the color of emission, which remains blue.

Figure 5:
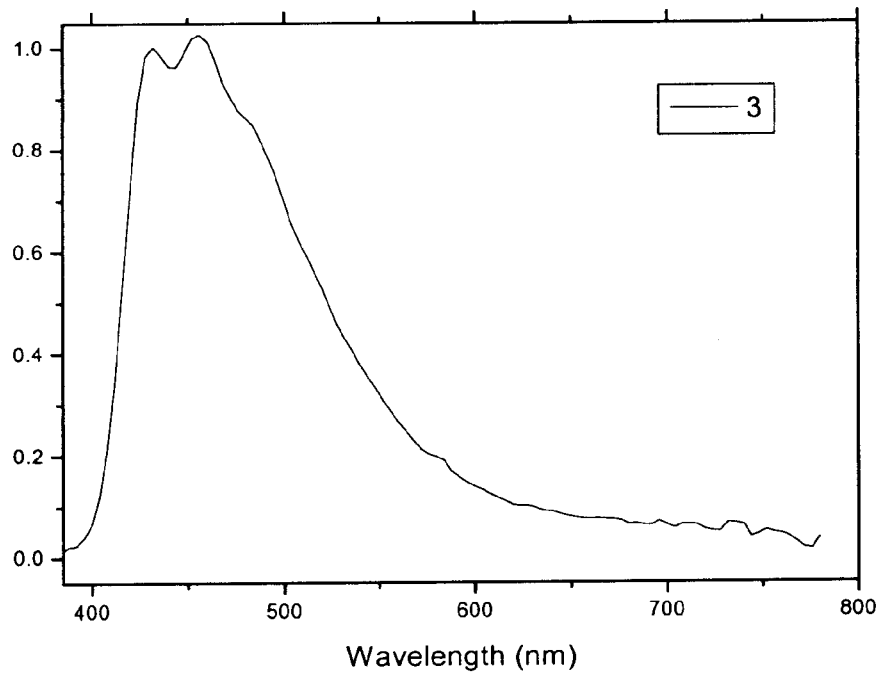
FIG. 5 shows the electroluminescent spectrum (curve 3) of another OLED with TPD alone as the hole transport layer.

A comparison with the electroluminescent spectrum obtained from an OLED with TPD only as the hole transport layer (curve 3) is shown in FIG. 5. The OLED used to produce the curve in FIG. 5 consisted of an Indium Tin Oxide transparent conductive anode on a glass substrate, a thin LiF layer to promote hole injection, TPD as the hole transport layer, PBD as the electron transport layer and emitter, a thin LiF layer to promote electron injection and an Al cathode. The comparison shows that the electroluminescence spectrum obtained in the device of FIG. 3 is due to the incorporation of PEHC.

SECOND EXAMPLE

Figure 6:
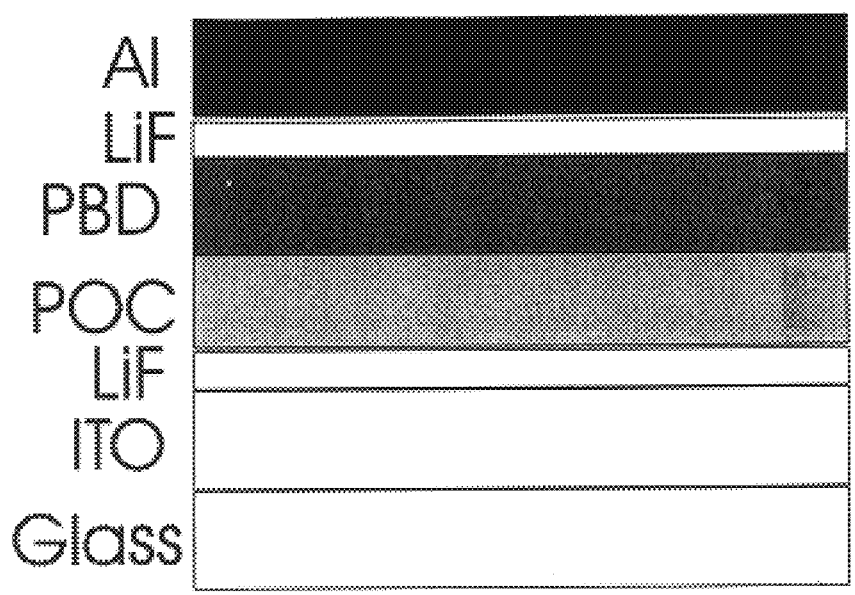
FIG. 6 shows a second embodiment of the invention where an OLED is formed using a POC polycarbazole thin film as the emitter.

In a second embodiment of the invention shown in FIG. 6, an OLED was fabricated consisting of an Indium Tin Oxide transparent conductive anode on a glass substrate, a first thin LiF layer to promote hole injection, a POC (poly(N-octyl-2,7-carbazole)) for the hole transport layer, Bu-PBD (2-(4-biphenylyl)-5-(4-tert-butylphenyl)-1,3,4-oxadiazole) as the electron transport layer, a second thin LiF layer to promote electron injection, and an Al cathode.

Figure 7:
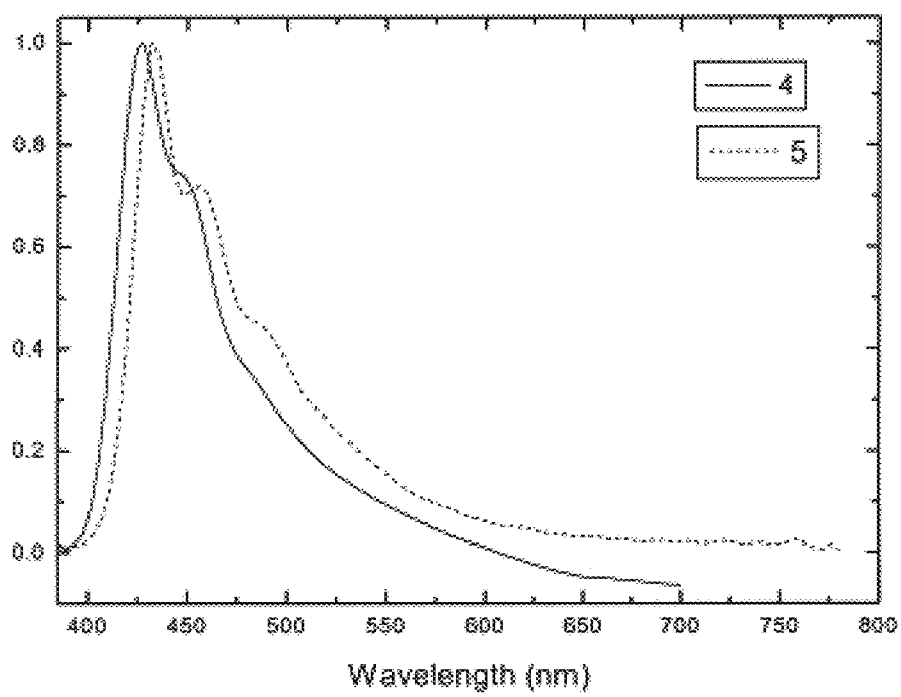
FIG. 7 shows the photoluminescence spectrum of POC in the solid state (curve 4) and the EL spectrum of the diode described in FIG. 5 (curve 5)

FIG. 7 shows that the resulting diode emits blue light with emission peaks around 423 and 447 nm (shoulder), with another weak shoulder around 480 nm, for photoluminescence (curve 4) and electroluminescence (curve 5). The peaks are slightly shifted towards higher wavelengths for the electroluminescence, but no excimer is observed. This small shift and broadening of the peaks could be due to the cavity effect when an excess of electrons is injected on the molecule, or to an increased radiative decay from longer conjugated segments having a smaller gap.[See, for example, A. Donat-Bouillud et al. Chem. Mater., 12, 1931 (2000) and ref. within—P. E. Burrows, J. Appl. Phys. Lett., (1996), 79, 7991].

A comparison with the electroluminescent spectrum obtained from an OLED with TPD only as the hole transport layer (curve 3) in FIG. 5 shows that the electroluminescence spectrum obtained in the device of FIG. 6 is due to the incorporation of POC.

The invention thus permits the production of efficient OLEDs that may be effective in the red and blue regions of the spectrum.

THIRD EXAMPLE

In a third embodiment of the invention, an OLED was fabricated consisting of an Indium Tin Oxide transparent conductive anode on a glass substrate, a thin LiF layer to promote hole injection, a blend of P(OCDOF) (poly(N-octyl-2,7-carbazole-alt-9,9'-dioctyl-2,7-fluorene) and TPD (N,N'-diphenyl-N,N'-bis(3-methylphenyl)-1,1'-biphenyl-4, 4'-diamine) as the hole transport layer and emitter, Bu-PBD (2-(4-biphenylyl)-5-(4-tert-butylphenyl)-1,3,4-oxidiazole) as the electron transport layer, a thin LiF layer to promote electron injection, and an Al cathode. See FIG. 8. The blend of P(OCDOF) and TPD is solubilized in chloroform:toluene in a ration of 9.8:0.2, and spin-coated. PBD, LiF and Al layers are thermally evaporated.

Figure 9:
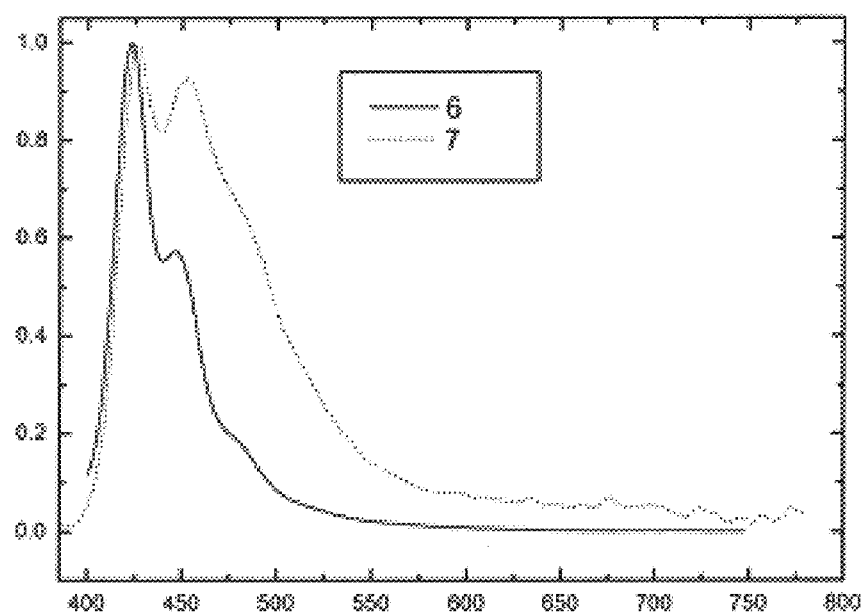
FIG. 9 shows the photoluminescence spectrum of P(OCDOF) in the solid state (curve 6) and the electroluminescent spectrum of the diode described in FIG. 3 (curve 7).

The diode produces the electroluminescence spectrum (curve 7) shown in FIG. 9, compared with the photoluminescence spectrum (curve 6) of P(OCDOF) in the solid state.

Both spectra seem to show a maximum of emission at similar wavelengths, i.e. in the blue range, with two peaks around 423 nm and 447 nm. The electroluminescence is thus originating from the polymer itself. No emission of an excimer is observed (no emission peak at higher wavelength). The relative intensity of the peaks are different in PL and EL, and this may be due to a difference in morphology of both films. TPD or PBD do not seem to affect the color of emission, which remains blue.

Figure 8:
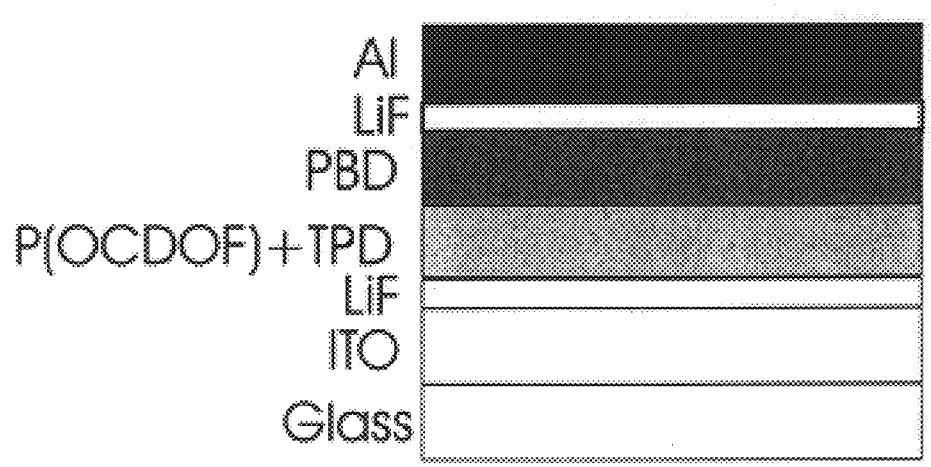
FIG. 8 shows a first embodiment of the invention where an OLED is formed using a P(OCDOF) copolymer thin film as the emitter. The diode consists of an Indium Tin Oxide transparent conductive anode on a glass substrate, a thin LiF layer to promote hole injection, a blend of P(OCDOF) and TPD as the hole transport layer and emitter, Bu-PBD as the electron transport layer, a thin LiF layer to promote electron injection and an Al cathode.

A Comparison with the electroluminescent spectrum obtained from an OLED with TPD only as the hole transport layer (curve 3) in FIG. 5 shows that the electroluminescence spectrum obtained in the device of FIG. 8 is due to the incorporation of P(OCDOF).

We claim:

1. An Organic Light Emitting Diode (OLED) including as active material a compound represented by the formula:

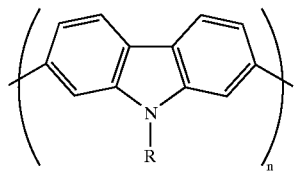

wherein

R is a substituent selected from the group consisting of $C_1$–$C_{22}$ linear or branched alkyl group, poly (ethyleneoxy), cyano, aryl, amide, and benzoyl; and n is an integer of about 3 to about 100.

2. An OLED as claimed in claim 1, wherein said compound is (poly(N-ethylhexyl)-2,7-carbazole) (PEHC).

3. An OLED as claimed in claim 2, wherein said compound is mixed with a second active material.

4. An OLED as claimed in claim 3, wherein said second active material is (N,N'-diphenyl-N,N'-bis(3-methylphenyl)-1,1'-biphenyl-4,4'-diamine)(TPD).

5. An OLED as claimed in claim 1, wherein said compound is (poly(N-octyl-2,7-carbazole)(POC).

6. An Organic Light Emitting Diode (OLED) comprising:
   a hole transport layer; and
   an electron transport layer;
   wherein at least one of said hole transport layer and said electron transport layer comprises either alone or in combination as active material a compound of the formula:

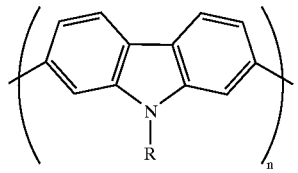

wherein

R is a substituent selected from the group consisting of $C_1$–$C_{22}$ linear or branched alkyl group, poly (ethyleneoxy), cyano, aryl, amide, and benzoyl; and n is an integer of about 3 to about 100.

7. An OLED as claimed in claim 6, further comprising a carrier promotion layer adjacent at least one of said electron transport layer and said hole transport layer.

8. An OLED as claimed in claim 7, herein said carrier promotion layer is LiF.

9. An OLED as claimed in claim 8, wherein said hole transport layer is a blend of PEHC (poly(N-ethylhexyl)-2,7-carbazole) and TPD (N,N'-diphenyl-N,N-bis(3-methylphenyl)-1,1'-biphenyl-4,4'-diamine) and said electron transport layer is Bu-PBD (2-(4-biphenylyl)-5-(4-tert-butylpbenyl)-1,3,4-oxadiazole).

10. An OLED as claimed in claim 8, wherein said hole transport layer is POC (poly(N-octyl-2,7-carbazole)) and said electron transport layer is Bu-PBD (2-(4-bipbenylyl)-5-(4-tert-butylphenyl)-1,3,4-oxadiazole).

11. An OLED as claimed in claim 8, wherein said hole transport layer is a blend of P(OCDOF)(poly(N-octyl-2,7-carbazole-alt-9,9'-dioctyl-2,7-fluorene) and TPD (N,N'-diphenyl-N,N'-bis(3-methylphenyl)-1,1'-biphenyl-4,4'-diamine) ans said electron transport layer is Bu-PBD (2-(4-biphenylyl)-5-(4-tert-butylphenyl)-1,3,4-oxadiazole).

12. An Organic Light Emitting Diode (OLED) including as active material a compound of the formula:

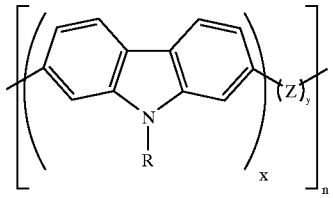

wherein

R is a substituent selected from the group consisting of $C_1$–$C_{22}$ linear or branched alkyl group, poly (ethyleneoxy), cyano, aryl, amide, and benzoyl;

Z is a co-monomer selected from the group consisting of ethylene, acetylene, $C_6$–$C_{22}$-aromatic groups, $C_2$–$C_{10}$-heterocyclic groups, and tertiary amines;

x is an integer between 1 and 100;

y is an integer between 0 and 100; and n is an integer between about 3 to about 100;

wherein when y is greater than 1, each Z may be the same or different.

13. An OLED as claimed in claim 12, wherein y is between 1 and 100.

14. An OLED as claimed in claim 13, wherein Z is a co-monomer selected from groups, and tertiary amines.

15. An OLED as claimed in claim 14, wherein Z is a $C_6$–$C_{22}$ aromatic selected from the group consisting of: fluorene, anthracene, phenylene, naphthylene, acenaphthene, phenanthrene, fluoranthene, pyrene, perylene, rubrene, chrysene, tetracene and pentacene.

16. An OLED as claimed in claim 15, wherein Z is fluorene.

17. An OLED as claimed in claim 14, wherein Z is a tertiary arylamine groups selected from the group consisting of: triphenylamine, N,N'-diphenylbenzidine, N,N'-diphenyl-1,4-phenylenediamine, and diphenylnaphthylamine, olefinic, arylamino, aromatic, and heterocyclic aromatic groups containing up to 30 carbons, substituted optionally with one or more substituents.

18. An OLED as claimed in claim 17, wherein said substituents are selected from the group consisting of: $C_1$–$C_{20}$hydrocarbyl radicals, $C_1$–$C_{20}$(thio)alkoxy radicals, $C_1$–$C_{20}$(thio)aryloxy radicals, cyano, fluoro, chloro, $C_1$–$C_{20}$alkoxycarbonyl, $C_1$–$C_{20}$aryoxylcarbonyl, poly (alkyleneoxy) and alkyl(aryl)sulfonyl radicals.

19. An OLED as claimed in claim 18, wherein said substituents are selected from the group consisting of: alkyl, alkoxy, poly(alkyleneoxy), and cyano.

20. An OLED as claimed in claim 14, wherein Z is a $C_2$–$C_{10}$ heterocylic group selected from the group consisting of: 5-member heterocycles, 6-member heterocycles, benzo-fused ring systems, and polynuclear fused condensed ring systems.

21. An OLED as claimed in claim 20, wherein the $C_2$–$C_{10}$ heterocyclic group is selected from the group consisting of: furan, thiophene, pyrrole, oxazole, isooxazole, oxadiazoles, thiazole, isothiazole, imidazole, thiadiazole, and pyrazoles.

22. An OLED as claimed in claim 20, wherein the $C_2$–$C_{10}$ heterocyclic group is selected from the group consisting of: pyridine, pyridazine, pyrimidine, pyrazine, triazines, and tetrazene.

23. An OLED as claimed in claim 20, wherein the $C_2$–$C_{10}$ heterocyclic group is selected from the group consisting of: benzoxazole, benzothiazole, benzimidazole, quinoline, isoquinoline, cinnoline, quinazoline, quinoxaline, phthalazine, benzothiadiazole, and benzotriazines.

24. An OLED as claimed in claim 20, wherein the $C_2$–$C_{10}$ heterocyclic group is selected from the group consisting of: phenazine, phenanthridine, acridine, and diphenylene oxide.

25. An Organic Light Emitting Diode (OLED) comprising:
   a hole transport layer, and
   an electron transport layer;
   wherein at least one of said hole transport layer and said electron transport layer comprises either alone or in combination as active material a compound of the formula:

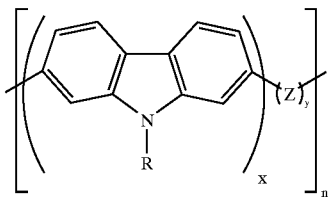

wherein

R is a substituent selected from the group consisting of $C_1$–$C_{22}$ linear or branched alkyl group, poly(ethyleneoxy), cyano, aryl, amide, and benzoyl;

Z is a co-monomer selected from the group consisting of ethylene, acetylene, $C_6$–$C_{22}$-aromatic groups, $C_2$–$C_{10}$-heterocyclic groups, and tertiary amines;

x is an integer between 1 and 100;

y is an integer between 0 and 100; and n is an integer between about 3 to about 100;

wherein when y is greater than 1, each Z may be the same or different.

26. An OLED as claimed in claim 25, wherein y is between 1 and 100.

27. An OLED as claimed in claim 26, wherein Z is a co-monomer selected from the group consisting of acetylene, $C_6$–$C_{22}$-aromatic groups, $C_2$–$C_{10}$-heterocyclic groups, and tertiary amines.

28. An OLED as claimed in claim 27, wherein Z is a $C_6$–$C_{22}$ aromatic group selected from the group consisting of: fluorene, anthracene, phenylene, naphthylene, acenaphthene, phenanthrene, fluoranthene, pyrene, perylene, rubrene, chrysene, tetracene and pentacene.

29. An OLED as claimed in claim 28, wherein Z is fluorene.

* * * * *